(12) United States Patent
Cheng et al.

(10) Patent No.: US 7,638,381 B2
(45) Date of Patent: Dec. 29, 2009

(54) METHODS FOR FABRICATING A SEMICONDUCTOR STRUCTURE USING A MANDREL AND SEMICONDUCTOR STRUCTURES FORMED THEREBY

(75) Inventors: Kangguo Cheng, Beacon, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 11/246,830

(22) Filed: Oct. 7, 2005

(65) Prior Publication Data
US 2007/0082437 A1    Apr. 12, 2007

(51) Int. Cl.
  H01L 21/336   (2006.01)
  H01L 21/8234  (2006.01)
  H01L 21/00    (2006.01)
  H01L 21/84    (2006.01)
  H01L 21/3205  (2006.01)

(52) U.S. Cl. .................. 438/197; 438/585; 438/157; 438/584

(58) Field of Classification Search .............. 438/197, 438/157, 176, 585, 596, 98, 100, 584, 688, 438/195
See application file for complete search history.

(56) References Cited

U.S. PATENT DOCUMENTS

| | | | |
|---|---|---|---|
| 5,494,837 A * | 2/1996 | Subramanian et al. | 438/149 |
| 5,952,694 A * | 9/1999 | Miyawaki et al. | 257/347 |
| 6,159,807 A * | 12/2000 | Bryant et al. | 438/289 |
| 6,441,422 B1 * | 8/2002 | Mandelman et al. | 257/300 |
| 6,894,310 B2 * | 5/2005 | Gonzalez et al. | 257/65 |
| 6,913,974 B2 * | 7/2005 | Hung et al. | 438/257 |
| 7,259,425 B2 * | 8/2007 | An et al. | 257/341 |
| 7,279,375 B2 * | 10/2007 | Radosavljevic et al. | 438/197 |
| 2007/0235734 A1 * | 10/2007 | Takafuji et al. | 257/57 |

OTHER PUBLICATIONS

Edward J. Nowak et al., "Turning Silicon on its Edge. Overcoming Silicon Scaling Barriers with Double-Gate and FinFET Technology", IEEE Circuits & Devices Magazine, Jan./Feb. 2004, pp. 20-31, USA.

N. Sato et al., "Precise Thickness control for Ultra-Thin SOI in ELTRAN® SOI-Epi™ Wafer", 2002 IEEE International SOI Conference, 2002, pp. 209-210, Japan.

Melanie J. Sherony et al., "Reduction of Threshold Voltage Sensitivity in SOI MOSFET's", IEEE Electron Device Letters, Mar. 1995, pp. 100-102, vol. 16, No. 3, USA.

(Continued)

Primary Examiner—Chuong Anh Luu
(74) Attorney, Agent, or Firm—Wood, Herron & Evans, LLP

(57) ABSTRACT

Methods of fabricating a semiconductor structure in which a body of monocrystalline silicon is formed on a sidewall of a sacrificial mandrel and semiconductor structures made by the methods. After the body of monocrystalline silicon is formed, the sacrificial material of the mandrel is removed selective to the monocrystalline silicon of the body. The mandrel may be composed of porous silicon and the body may be fabricated using either a semiconductor-on-insulator substrate or a bulk substrate. The body may be used to fabricate a fin body of a fin-type field effect transistor.

15 Claims, 10 Drawing Sheets

OTHER PUBLICATIONS

Bin Yu et al., "FinFET Scaling to 10nm Gate Length", 2002, pp. 251-254, Strategic Technology, Advanced Micro Devices, Inc., Department of EECS, University of California, Berkeley, CA, USA.

D. F. Timokhov, et al., "Determination of Structure Parameters of Porous Silicon by the Photoelectric Method", Journal of Physical Studies, 2004, pp. 173-177, vol. 8, No. 2, Odessa National University, Odessa, Ukraine.

Luu, Chuong A. (Examiner), US Patent and Trademark Office, Notice of Allowance issued in related U.S. Appl. No. 11/924,875 dated May 7, 2009.

* cited by examiner

METHODS FOR FABRICATING A SEMICONDUCTOR STRUCTURE USING A MANDREL AND SEMICONDUCTOR STRUCTURES FORMED THEREBY

FIELD OF THE INVENTION

The invention relates generally to methods for fabricating semiconductor structures and semiconductor structures and, in particular, to methods of forming a body of monocrystalline silicon using a temporary mandrel of a sacrificial material and monocrystalline silicon bodies formed by these methods.

BACKGROUND OF THE INVENTION

Non-planar, three-dimensional device structures are being investigated for use in integrated circuits as a replacement for planar devices, which have limitations on scalability. In particular, fin-type field effect transistors (FinFETs) are low-power, high speed non-planar devices that can be more densely packed on a substrate than traditional planar transistors. In addition, FinFETs also offer superior short channel scalability, reduced threshold voltage swing, higher mobility, and the ability to operate at lower supply voltages than traditional planar transistors.

Integrated circuits that include FinFETs may be fabricated on a bulk silicon substrate or, more commonly, on a silicon-on-insulator (SOI) wafer that includes an active SOI layer of a single crystal semiconductor, such as silicon, a semiconductor substrate, and a buried insulator layer that separates and electrically isolates the semiconductor substrate from the SOI layer. Each FinFET includes a narrow vertical fin body of single crystal semiconductor material with vertically-projecting sidewalls. A gate contact or electrode intersects a channel region of the fin body and is isolated electrically from the fin body by a thin gate dielectric layer. Flanking the central channel region at opposite ends of the fin body are heavily-doped source/drain regions. When a voltage exceeding a characteristic threshold voltage is applied to the gate electrode, a depletion/inversion layer is formed in the channel region that permits carrier flow between the source/drain regions (i.e., the device output current).

A FinFET may be operated in two distinct modes contingent upon the characteristics of the depletion/inversion layer. A FinFET is considered to operate in a partially-depleted mode when the depletion/inversion layer fails to extend completely across the width of the fin body. The undepleted portion of the fin body in the channel region is electrically conductive and slowly charges as the FinFET is switched to various voltages depending upon its most recent history of use. This floating body effect in partially-depleted FinFETs reduces the reproducibility of device operation by changing the body potential during device operation.

A FinFET is considered to operate in a fully-depleted mode when the depletion/inversion layer extends across the full width of the fin body. A fully-depleted FinFET exhibits performance gains in comparison with operation in a partially-depleted mode. Significant reductions in leakage current, because of strong gate control, dissipate less power into the substrate, which reduces the likelihood of device overheating. Furthermore, parasitic capacitances are greatly reduced in fully-depleted FinFETs, which significantly improves the device switching speed.

Because of the advantages of operating a FinFET in a fully-depleted mode, control of the width of the fin body is important for optimizing FinFET performance. Conventional methods of forming the fin body utilize subtractive etching in which a uniformly thick layer of single crystal silicon is patterned by masking and etching with a process like reactive ion etching (RIE). The width of the fin body is related to the line width of a resist mask or a hard mask. The nominal line width is specified either by photolithographic techniques or by sidewall image transfer from an overlying spacer but may be influenced by other factors, as explained below.

Conventional subtractive etching techniques for forming the fin body of a FinFET fail to precisely and accurately define the fin body shape. In particular, subtractive etching unwantedly tapers the width of the fin body by about 10 percent or more. Variations in the fin body width result in unacceptably large variations in the threshold voltage of the FinFET because the threshold voltage varies along the height of the tapered fin body. More specifically, the threshold voltage will be higher near the base of the fin body than near the narrower tip. As a result, the activated FinFET will have a reduced current density near the base and not take advantage of the full device capability.

One persistent source of fin body tapering arises from the minor isotropic component of ideally anisotropic RIE processes. The minor isotropic component will cause the width of the fin body to depend upon the exposure time to the etchant. Consequently, the tip of the fin body, which has a longer exposure time to the etchant, will be slightly thinner than the base of the fin body. Another persistent source of fin body tapering is mask erosion that originates from progressive etching of the mask material during the RIE process. Specifically, the RIE process is non-selective against the mask material. Lateral erosion recedes the edges of the mask material protecting the underlying semiconductor material from the etchant. Because the dimensions change with increasing etching time, the resultant width of the fin body tapers with increasing height.

Conventional FinFET fabrication techniques based upon subtractive etching may introduce large variations in the shape of fin bodies formed across the surface of any single wafer and among multiple wafers in a wafer line. In particular, etchant consumption varies across the wafer surface as a function of feature or pattern density. Specifically, etchant is consumed faster in regions on the wafer surface with high pattern density, which leads to the necessity of overetching in these high pattern density regions to achieve a fully defined fin body. However, the lengthened exposure to the etchant unwantedly results in thinner fin bodies in low pattern density regions than in high pattern density regions. For FinFETs fabricated on a bulk substrate, the height of the fin bodies will vary across the wafer surface because of overetching in high pattern density regions. Changes in the etch loading to compensate for etchant consumption may also cause non-uniformities in the fin body width.

What is needed, therefore, are fin bodies for a FinFET and methods of making the fin bodies with improved precision in shape control that overcome the various disadvantages of conventional semiconductor structures and methods of making such semiconductor structures.

SUMMARY OF THE INVENTION

The present invention is generally directed to methods of making a semiconductor structure in which a body of monocrystalline silicon is formed on a vertically-projecting sidewall of a temporary mandrel constituted by a sacrificial material and semiconductor structures made by the methods. After the body is formed, the sacrificial material of the mandrel is removed selective to the monocrystalline silicon in the body.

The sacrificial material may be advantageously constituted by porous silicon, which has a significantly higher etch rate than monocrystalline silicon.

The fabrication procedure of the present invention permits a freestanding vertical monocrystalline silicon body to be formed without a loss of width or shape control, which solves a significant deficiency of conventional fabrication processes that rely on subtractive etching. The fabrication procedure is free of subtractive etching artifacts that afflict conventional fabrication procedures and negatively impact process control. Because subtractive etching is eliminated from body definition, variations in the body width or shape across the surface of any single wafer and among multiple wafers in a wafer line will be considerably reduced.

The freestanding monocrystalline silicon body may be advantageously used as a fin body in a fin-type field effect transistor (FinFET). Because of the substantially uniform body width, the activated FinFET of the present invention will have a relatively uniform current density over its vertical height and will accordingly take advantage of the full device capability.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
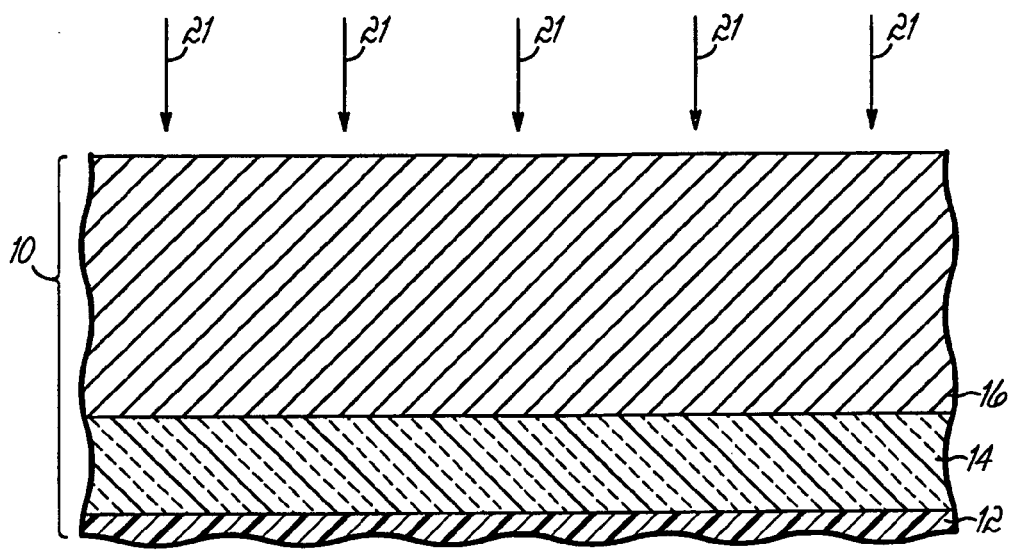
FIGS. 1-7 are diagrammatic cross-sectional views of a portion of an SOI wafer at various fabrication stages of a processing method in accordance with an embodiment of the present invention.

The present invention provides methods of making a semiconductor structure consisting of a monocrystalline silicon body that may be used as a fin body in a fin-type field effect transistor (FinFET), as well as semiconductor structures made by the methods. The body, which may built by the present invention on a semiconductor-on-insulator (SOI) wafer or on a bulk substrate, is formed with significantly improved shape control in comparison with conventional subtractive etching methods of making such bodies. These substantially uniform width, narrow bodies of low-defect density monocrystalline silicon are ideal for use as fin bodies in fully-depleted FinFET device structures. The present invention will now be described in greater detail by referring to the drawings that accompany the present application.

Figure 2:
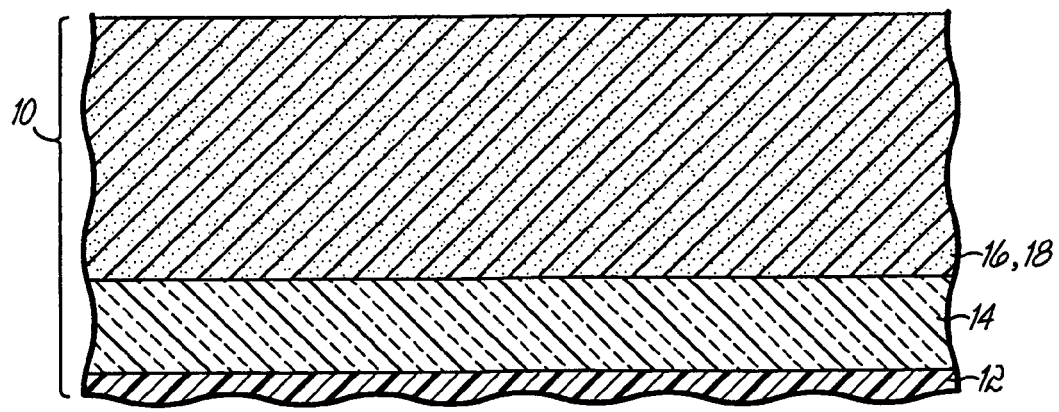

With reference to FIGS. 1 and 2 and in accordance with an embodiment of the present invention, an SOI wafer 10 comprises a semiconductor substrate 12, a buried insulator layer 14 formed of an insulating material such as oxide (e.g., $SiO_2$), and an active semiconductor or SOI layer 16 separated from the semiconductor substrate 12 by the intervening buried insulator layer 14. The semiconductor substrate 12 and SOI layer 16 are each constituted by single crystal or monocrystalline silicon. The SOI layer 16, which is considerably thinner than the semiconductor substrate 12, is electrically isolated from the semiconductor substrate 12 by the buried insulator layer 14. The SOI wafer 10 may be fabricated by any suitable conventional technique, such as a wafer bonding technique or a separation by implantation of oxygen (SIMOX) technique, familiar to a person having ordinary skill in the art.

The thickness of the SOI layer 16, which determines the vertical height of the completed fin bodies 34, 36 (FIG. 7), may be about 30 nanometers (nm) to about 1000 nm. If needed, the SOI layer 16 of a standard commercial SOI wafer may be thickened by epitaxial growth of the constituent semiconductor material (e.g., silicon). The lower limit on the thickness of the SOI layer 16 is limited only by the capability of the process forming the SOI wafer 10 and may be less than 30 nm.

A masking layer (not shown) of, for example, nitride (e.g., $Si_3N_4$), is deposited by a conventional deposition process, such as chemical vapor deposition (CVD) or plasma-assisted CVD, and patterned to open windows that expose the SOI layer 16 across a plurality of active regions, of which a single representative active region 18 is shown in FIG. 1. Each active region 18 is converted from monocrystalline silicon to porous silicon through the entire thickness extending to the depth of the interface between the SOI layer 16 and the buried insulator layer 14. The masked portions (not shown) of the SOI layer 16 retain their initial condition while the active regions 18 are modified.

In one embodiment of the invention, the monocrystalline silicon of SOI layer 16 in each active region 18 is converted to porous silicon by a process that includes doping and anodization. To that end, a high concentration of a p-type dopant 21 is introduced into the SOI layer 16 within each exposed active region 18 by, for example, gas phase doping, solid source doping, ion implantation, or a combination of these techniques. The p-type dopant 21 may be selected from gallium (Ga), aluminum (Al), boron (B), or a combination of these elements, and may be introduced at an atomic concentration ranging from about $5 \times 10^{17}$ cm$^{-3}$ to about $1 \times 10^{21}$ cm$^{-3}$. The SOI wafer 10 may be annealed during the doping process or optionally annealed after the p-type dopant is introduced to uniformly distribute the p-type dopant within the monocrystalline silicon of SOI layer 16.

The doped silicon in each doped active region 18 is then subjected to an anodization process in an aqueous electrolyte or anodization solution that typically contains hydrofluoric acid (HF), such as a mixture of HF and a monohydric alcohol such as methanol, ethanol, or n- or iso-propanol. The monohydric alcohol is added to the solution to improve the wettability of the hydrofluoric acid. The SOI wafer 10 is contacted with a positively-biased electrode and immersed along with a separate negatively-biased electrode into a bath of the anodization solution. An electrical current is flowed through the electrodes and the SOI layer 16 for an anodization time sufficient to convert the doped silicon in the exposed active regions 18 to porous silicon. A light source may be optionally used to illuminate the SOI wafer 10. The anodization process may be performed at room temperature or at a temperature above room temperature. Following the anodization process, the SOI wafer 10 is typically rinsed with deionized water and dried.

The anodization process creates pores throughout the thickness of the doped active regions 18. The resulting porosity is proportional to material properties like the p-type dopant concentration, and to other non-material properties such as the anodization current and voltage, the acid concentration in the anodization solution, illumination, and the temperature of the anodization solution. For example, the anodization process converting the SOI layer 16 to porous silicon may be carried out in an aqueous 1:1 HF (49%) and ethanol solution at a current density ranging from about 1 mA/cm² to about 40 mA/cm² in the dark and at room temperature with a process time ranging from several minutes to one hour. Following anodization, the mask (not shown) protecting other regions of the SOI layer 16 is stripped before the subsequent fabrication stage.

Figure 3:
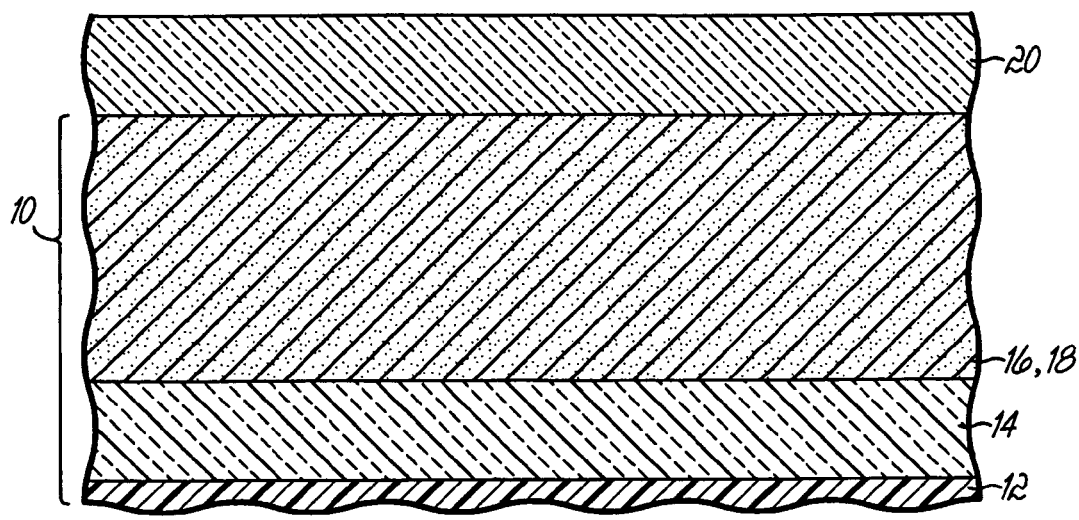

With reference to FIG. 3 in which like reference numerals refer to like features in FIG. 2 and at a subsequent fabrication stage, a pad layer 20 is formed on the SOI layer 16 across the surface of SOI wafer 10. The pad layer 20 may be composed of nitride formed utilizing a conventional deposition process such as CVD or plasma-assisted CVD. The material constituting pad layer 20 is selected such that pad layer 20 functions as a hardmask and as a polish stop layer during subsequent fabrication stages. The material forming pad layer 20 must also etch selectively to the material constituting the SOI layer 16. The vertical thickness of the pad layer 20 may be about 10 nm to about 1000 nm.

Figure 4:
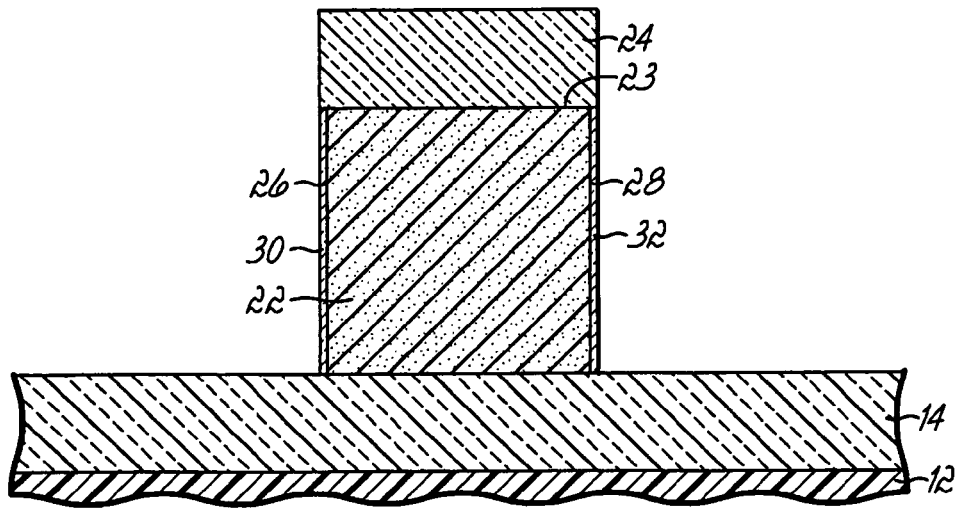

With reference to FIG. 4 in which like reference numerals refer to like features in FIG. 3 and at a subsequent fabrication stage, the pad layer 20 is patterned by a conventional lithography and etching process. The lithography process applies a radiation-sensitive resist (not shown) on pad layer 20, exposes the resist to a pattern of radiation (e.g, light, x-rays, or an electron beam), and develops the latent transferred pattern in the exposed resist. The resist pattern is transferred to the SOI layer 16 by a series of anisotropic dry etches, such as reactive-ion etching (RIE) or a plasma etching process, that patterns the pad layer 20 using the patterned resist as an etch mask and then patterns the SOI layer 16 using the patterned pad layer 20 as an etch mask. The latter dry etching process removes the material of the SOI layer 16 selective to the material of the buried insulator layer 14. The etching process, which removes unprotected portions of the constituent porous silicon of SOI layer 16, leaves behind a plurality of mandrels, of which one representative mandrel 22 is shown, of porous silicon. Mandrel 22 has an upper surface 23 covered by a protective cap 24 representing residual material from the patterned pad layer 20. The sidewalls 26, 28 of the mandrel 22 project substantially vertically from the buried insulator layer 14 and are oriented substantial perpendicular to their intersection with the buried insulator layer 14.

Thin surface layers 30, 32 are formed on the sidewalls 26, 28, respectively, of mandrel 22. The surface layers 30, 32 smooth surface roughness and seal pores in the porous silicon of mandrel 22 that would otherwise intersect the sidewalls 26, 28 and open to, or communicate with, the ambient environment about the mandrel 22. One process suitable for forming surface layers 30, 32 is a hydrogen anneal in a hydrogen-rich atmosphere, such as $H_2$ or $NH_4$, at a temperature between 850° C. and 1100° C., and for a time ranging from about 10 seconds to about 30 minutes. The protective cap 24 prevents the formation of a surface layer, similar to surface layers 30, 32, on the upper surface 23 of mandrel 22, which is beneficial for removing the sacrificial mandrel 22 during a subsequent fabrication stage.

The process forming the surface layers 30, 32 may also advantageously reduce the p-type dopant concentration in the porous silicon of each mandrel 22. In particular, the duration of the hydrogen anneal may be extended beyond the time required to form the surface layers 30, 32 for further depleting the p-type dopant from the porous silicon of each mandrel 22.

Figure 5:
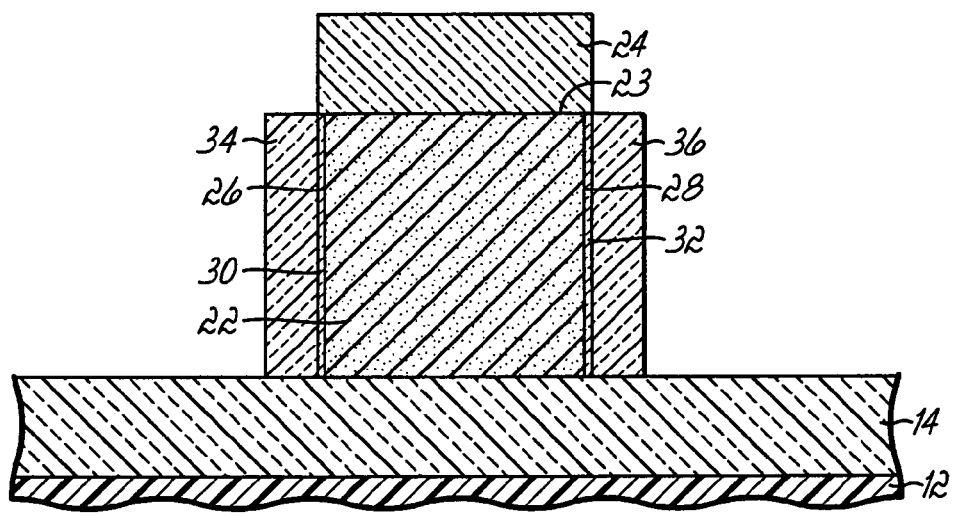

With reference to FIG. 5 in which like reference numerals refer to like features in FIG. 4 and at a subsequent fabrication stage, fin bodies or fins 34, 36 each consisting of a monocrystalline silicon body are epitaxially grown on the respective sidewalls 26, 28 of each mandrel 22 selective to the materials of the buried insulator layer 14 and protective cap 24 (e.g., oxide and nitride). Surface layers 30, 32 operate as barriers that reduce the likelihood of thermally-driven diffusion of the p-type dopant from the mandrel 22 into the fins 34, 36. The selective epitaxial growth process forming fins 34, 36 favors nucleation of silicon on the mandrel 22 of the crystalline porous silicon, as opposed to the dielectric materials constituting the buried insulator layer 14 and the protective cap 24. Selective epitaxial growth processes for forming epitaxial silicon are familiar to persons having ordinary skill in the art.

The fins 34, 36 flank the opposite sidewalls 26, 28 of the mandrel 22 with a pitch or spacing determined by the distance between the sidewalls 26, 28. The thickness of the monocrystalline silicon constituting fins 34, 36 is less than 100 nm and may be as thin as about 1 nm. Typically, the thickness will be between 10 nm and about 100 nm. The thickness of the epitaxially-grown monocrystalline silicon layer determines the width of the fin 34 and the width of the fin 36. The width of the fins 34, 36 may be less than a minimum feature size of "1·F", wherein "F" refers to the effective resolution of a lithographic system or the minimum lithographic feature dimension that can be resolved in a lithographic exposure because conventional lithography and etching processes are not used to fabricate the fins 34, 36. Advantageously, the fins 34, 36 are formed without the assistance of a mask (i.e., masklessly).

Figure 6:
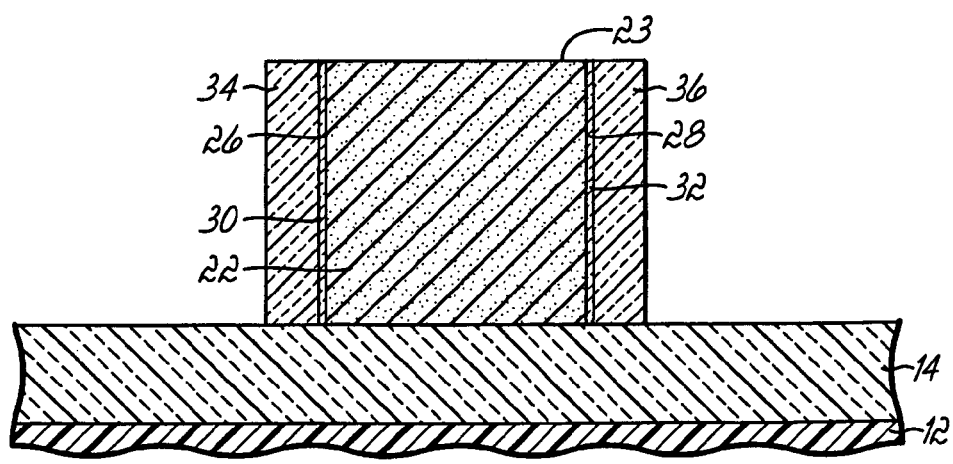

With reference to FIG. 6 in which like reference numerals refer to like features in FIG. 5 and at a subsequent fabrication stage, the protective cap 24 is removed from the mandrel 22. If protective cap 24 is composed of nitride and the buried insulator layer 14 is composed of oxide, the protective cap 24 may be removed by an etching process that removes nitride selective to silicon in the mandrel 22 and fins 34, 36 and to oxide in the buried insulator layer 14. For example, a wet isotropic etch process using hot acid, such as phosphoric acid, may be employed to remove nitride relative to silicon and oxide. After the protective cap 24 is removed, the upper surface 23 of the mandrel 22 is advantageously exposed.

Figure 7:
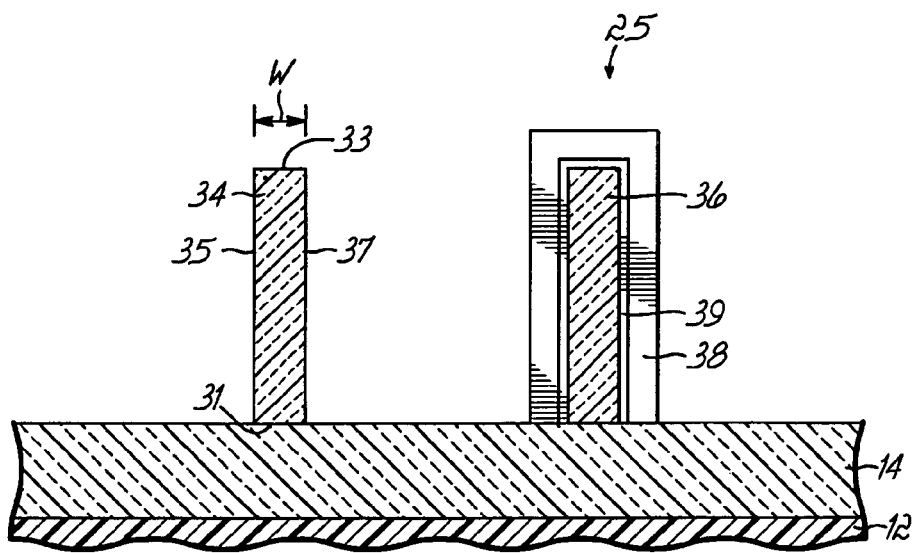

With reference to FIG. 7 in which like reference numerals refer to like features in FIG. 6 and at a subsequent fabrication stage, the mandrel 22 is removed from its intervening location between the fins 34, 36 using an etching process having a high selectivity for removing the porous silicon in the mandrel 22 relative to the monocrystalline silicon in fins 34, 36. For example, an aqueous etchant solution consisting of a mixture of HF, $H_2O_2$, and $H_2O$ exhibits an etch selectivity greater than about 10,000. The high etch rate ratio results in rapid removal of the porous silicon constituting mandrel 22 with a negligible effect on the monocrystalline silicon of the fins 34, 36 and the dielectric material of the buried insulator layer 14.

Fin 34 includes a base 31 that contacts the buried insulator layer 14, a tip 33 opposite base 31, and sidewalls 35, 37 connecting the base 31 with the tip 33. The sidewalls 35, 37 extend or project substantially perpendicular to the buried insulator layer 14. Fin 34 has a width, W, measured between the sidewalls 35, 37 that may be evaluated at any vertical location over the fin height between the base 31 and tip 33. The thickness of epitaxially-grown monocrystalline silicon on the sidewalls 26, 28 of mandrel 22 (FIG. 5) that forms fin 34 and defines the fin width is accurately controlled because of the ability to accurately control thickness during deposition (e.g., selective epitaxial growth process), as opposed to material removal to pattern a layer of single crystal silicon during a subtractive etching process. Consequently, any variation in the width of fin 34 between the base 31 and tip 33 is significantly less than the width variations that may occur in fins formed by conventional fabrication techniques that utilize subtractive etching. Advantageously, the width of fin 34 is substantially uniform at any vertical location between base 31 and tip 33. The variation in the width is expected to be less than about one (1) percent so that the sidewalls 35, 37 have a substantially straight vertical profile in a direction perpendicular to the horizontal plane of buried insulator layer 14. Similar considerations apply to fin 36, which is identical or substantially identical to fin 34, and to other fins (not shown) identical or substantially identical to fins 34, 36 distributed across the SOI wafer 10.

The fins 34, 36, which may be used for subsequent FinFET fabrication, remain as freestanding as narrow vertical structures of single crystal semiconductor material (e.g., silicon) on a dielectric substrate defined by the buried insulator layer 14. Advantageously, the relative position of the fins 34, 36 may be freely adjusted, as required by the circuit design, because the active region(s) 18 of SOI layer 16 are converted to porous silicon before the mandrels 44 are defined. The fins 34, 36 have a width that may be less than the minimum lithographic dimension and a relatively high aspect ratio. Subsequent fabrication steps include forming a gate electrode 38 that intersects a channel region of the fin 36, a gate dielectric 39 separating and electrically isolates the channel region of the fin 36 from gate electrode 38, and source/drain regions (not shown) in fin 36 and separated required for the operation of a FinFET 25. Although not shown in FIG. 7, similar or identical FinFETs are fabricated using fin 34 and other fins (not shown) distributed across the surface of SOI wafer 10. The construction of FinFET 25 and methods for constructing FinFET 25 are familiar to persons having ordinary skill in the art and, hence, will not be elaborated upon herein.

In another embodiment of the present invention, bodies of monocrystalline silicon similar to fins 34, 36 may be fabricated using a bulk substrate instead of SOI wafer 10 as described above. The description below details an alternative embodiment of the present invention in which the inventive bodies of monocrystalline silicon are fabricated using a bulk substrate.

Figure 8:
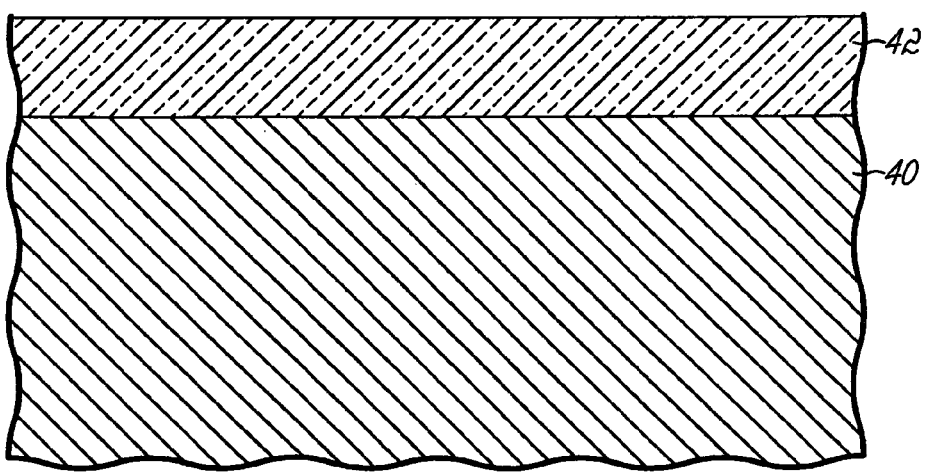
FIGS. 8-19 are diagrammatic cross-sectional views of a portion of a bulk substrate at various fabrication stages of a processing method in accordance with an alternative embodiment of the present invention.

With reference to FIG. 8 and in accordance with an alternative embodiment of the present invention, a standard bulk-type monocrystalline silicon substrate 40 is obtained and a pad layer 42 is formed on the exposed surface of the substrate 40. The pad layer 42 may be oxide formed by a CVD process and may have a thickness ranging from about 10 nm to about 1000 nm.

Figure 9:
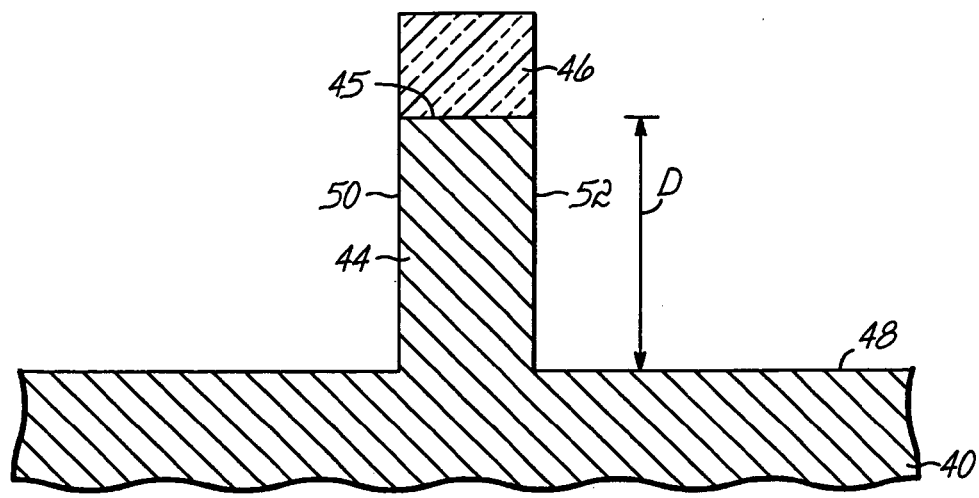

With reference to FIG. 9 in which like reference numerals refer to like features in FIG. 8 and at a subsequent fabrication stage, the pad layer 42 is patterned and its image is transferred into the underlying substrate 40 by an etching process, such as RIE, to define a mandrel 44 and a protective cap 46 on an upper surface 45 of the mandrel 44. The mandrel 44, which is shaped like a pillar or mesa, is constituted by the material of the substrate 40 and the protective cap 46 composed of the material of the pad layer 42. The recess depth, D, of an exposed surface 48 of the substrate 40 relative to the upper surface 45 of mandrel 44 eventually determines the height of the subsequently formed fins. The recess depth may range from about 5 nm to about 200 nm. The mandrel 44 has opposed sidewalls 50, 52 that extend substantially vertically from the juncture of the mandrel 44 with the exposed surface 48 to the upper surface 45 and are oriented substantial perpendicular to their intersection with the exposed surface 48. The width of the mandrel 44 between opposed sidewalls 50, 52 may range from about 25 nm to about 500 nm. Additional capped mandrels, not shown but substantially identical to mandrel 44, are distributed across the substrate 40.

Figure 10:
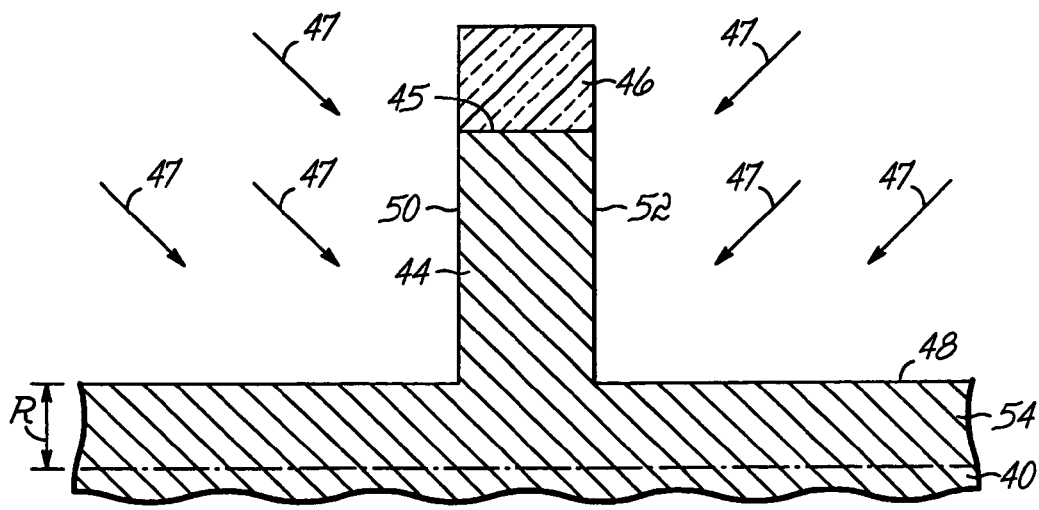

With reference to FIG. 10 in which like reference numerals refer to like features in FIG. 9 and at a subsequent fabrication stage, a heavy concentration of a p-type dopant 47 is introduced into the mandrel 44 and the substrate 40, as described above with regard to dopant 21 in FIG. 2. The penetration depth of the p-type dopant 47 relative to the sidewalls 50, 52 is sufficient to penetrate the width of the mandrel 44 and creates a modified surface layer or region 54 in the substrate 40 that typically extends into substrate 40 for a depth, R, ranging from about 50 nm to about 1000 nm below the recessed exposed surface 48. The maximum width for mandrel 44 may be determined by the ability to introduce a sufficient concentration of p-type dopant 47 throughout the mandrel 44.

Figure 11:
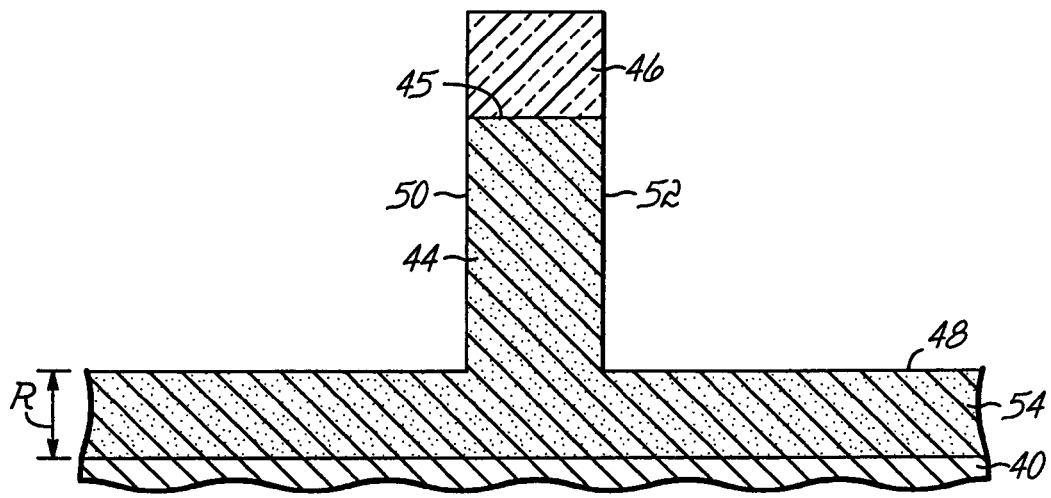

With reference to FIG. 11 in which like reference numerals refer to like features in FIG. 10 and at a subsequent fabrication stage, the substrate 40 is then subjected to an anodization process, as described above with regard to FIG. 2, that converts the p-type doped silicon in mandrel 44 to porous silicon. The anodization process also converts the p-type doped silicon in the modified surface region 54 of substrate 40 to porous silicon.

Figure 12:
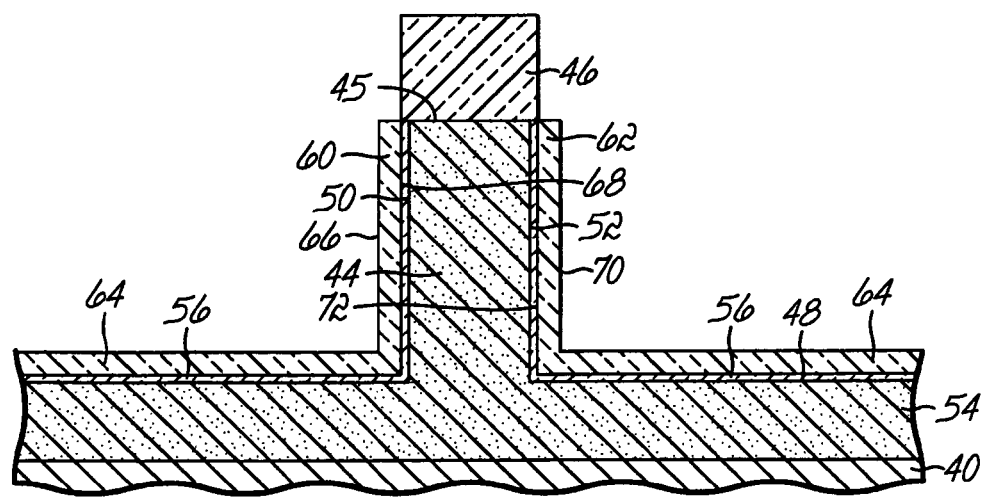

With reference to FIG. 12 in which like reference numerals refer to like features in FIG. 11 and at a subsequent fabrication stage, a thin surface layer 56 is formed on the sidewalls 50, 52 of the mandrel 44 and the exposed surface 48 of the modified surface region 54 by a process, such as hydrogen annealing, as described above with regard to FIG. 4. The surface layer 56 seals exposed porous silicon along the exposed surface 48 and sidewalls 50, 52. Advantageously, the surface layer 56 does not form on an upper surface 45 of the mandrel 44 beneath and bordering protective cap 46. As a result, the sacrificial material of the temporary mandrel 44 may be efficiently removed during a subsequent fabrication stage.

After the pores in the exposed surface 48 and sidewalls 50, 52 are closed by surface layer 56, fin bodies or fins 60, 62 each consisting of a monocrystalline silicon body are epitaxially grown on the respective sidewalls 50, 52 of the mandrel 44, as described above with regard to FIG. 5. The thickness of the epitaxially-grown monocrystalline silicon determines the width of the fins 60, 62. Surface layer 56 operates as a barrier that reduces the likelihood of thermally-driven diffusion of the p-type dopant from the mandrel 44 into the fins 60, 62. The fins 60, 62 flank the opposite sidewalls 50, 52 of the mandrel 44 with a spacing determined by the distance between the sidewalls 50, 52. The selective epitaxial growth process forming the fins 60, 62 also forms a layer 64 of monocrystalline silicon extending across surface 48.

Fin 60 has a sidewall 66 that is exposed and a sidewall 68, which is opposite to sidewall 66, that borders the surface layer 56 on the sidewall 50 of mandrel 44. Fin 62 has a sidewall 70 that is exposed and a sidewall 72 opposite to sidewall 70. Sidewall 72 borders the surface layer 56 on the sidewall 52 of mandrel 44. The width of the fins 60, 62 may be less than a minimum feature size of "1·F", wherein "F" refers to the effective resolution of a lithographic system or the minimum lithographic feature dimension that can be resolved in a lithographic exposure because conventional lithography and etching processes are not used to fabricate the fins 60, 62. Advantageously, the fins 60, 62 are formed without the assistance of a mask (i.e., masklessly). The thickness of the monocrystalline silicon constituting fins 60, 62 is less than 100 nm and may be as thin as about 1 nm. Typically, the thickness will be between 10 nm and about 100 nm.

Figure 13:
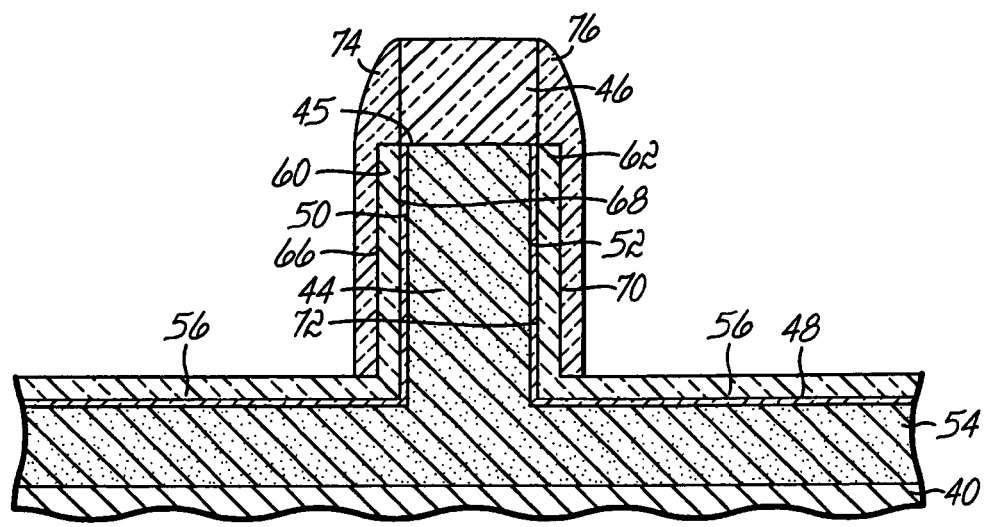

With reference to FIG. 13 in which like reference numerals refer to like features in FIG. 12 and at a subsequent fabrication stage, spacers 74, 76 are formed from a conformal layer (not shown) of a dielectric material, such as 5 nm to 50 nm of nitride deposited by CVD, that flank and cover the fins 60, 62, respectively. In particular, the spacers 74, 76 cover the exposed sidewalls 66, 70 of the fins 60, 62, respectively. Spacers 74, 76 may be defined from the conformal layer by an anisotropic etching process, such as RIE or plasma etching, that removes the material of the conformal layer primarily from horizontal surfaces selective (i.e., with a significantly greater etch rate) to the constituent materials of protective cap 46 and layer 64.

Figure 14:
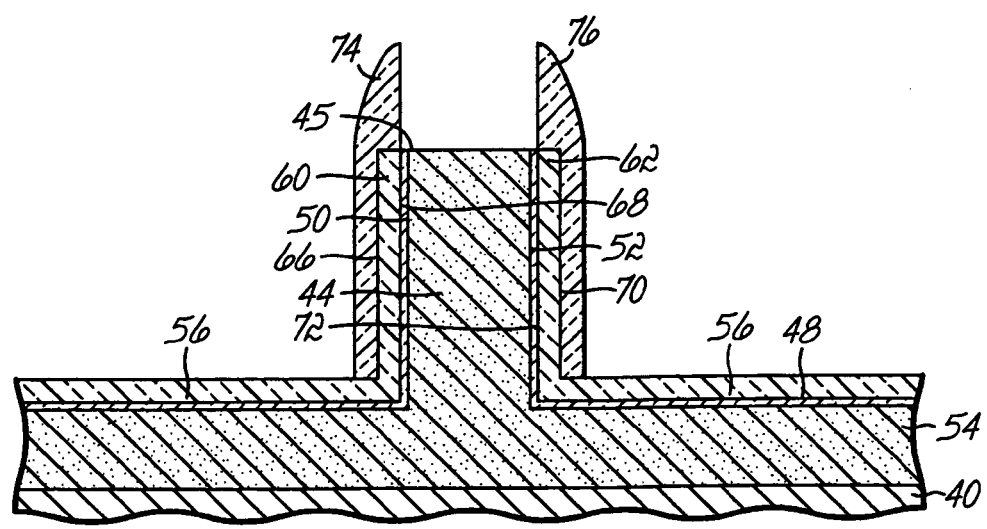

With reference to FIG. 14 in which like reference numerals refer to like features in FIG. 13 and at a subsequent fabrication stage, the protective cap 46 is removed by an etching process that removes the material of the protective cap 46 selective to the constituent materials of the spacers 74, 76 and the fins 60, 62. For example, the etching process may be a fluorine-containing wet or dry etch that removes oxide selective to nitride and silicon. After protective cap 46 is removed, the upper surface 45 of mandrel 44 is exposed.

Figure 15:
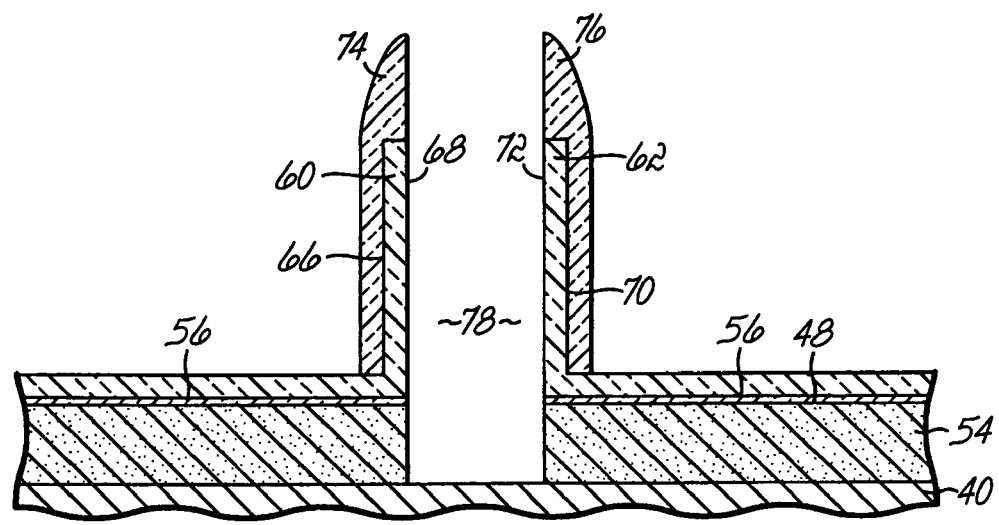

With reference to FIG. 15 in which like reference numerals refer to like features in FIG. 14 and at a subsequent fabrication stage, the mandrel 44 is then subjected to an etching process, such as RIE, that removes porous silicon in mandrel 44 with a high selectivity to the monocrystalline silicon constituting the fins 60, 62, layer 64, and substrate 40, and selective to the constituent material (e.g., nitride) of the spacers 74, 76. The etching process extends vertically to remove porous silicon in the volume of the modified surface region 54 that is vertically below mandrel 44 before mandrel 44 is removed. The etching process, which is halted at the depth of the substrate 40, opens a trench 78 between the fins 60, 62. Alternatively, the etching process may consist of an anisotropic etching process that removes the mandrel 44 to the vertical level of modified surface region 54, followed by an anisotropic etch that removes the volume of the modified surface region 54 to complete the trench 78. Sidewall 68 of fin 60 and sidewall 72 of fin 62 border the trench 78 and, hence, are revealed after mandrel 44 is removed.

Because of the high surface area of the porous silicon in mandrel 44 and modified surface region 54 in comparison with the non-porous silicon in substrate 40, porous silicon in the mandrel 44 and its underlying volume of modified surface region 54 are removed with remarkably high selectivity to the constituent non-porous silicon in substrate 40. The layer 64 of epitaxial monocrystalline silicon on surface 48 may be eroded or removed during the etching process, which is acceptable because any remnants of layer 64 are removed during a subsequent processing stage.

Figure 16:
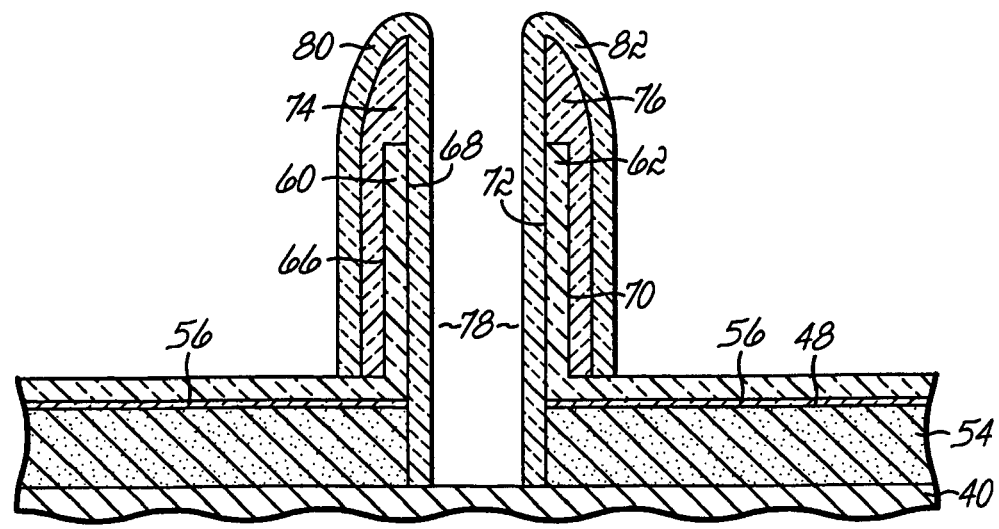

With reference to FIG. 16 in which like reference numerals refer to like features in FIG. 15 and at a subsequent fabrication stage, spacers 80, 82 are formed from a conformal layer (not shown) of a dielectric material, such as 5 nm to 50 nm of nitride deposited by CVD. Spacer 80 covers the sidewall 68 of fin 60 and extends to also cover spacer 74. Spacer 82 covers the sidewall 72 of fin 62 and extends to also cover spacer 76. Spacers 80, 82 may be defined by an anisotropic etching process, such as RIE or plasma etching, that removes the constituent material of the conformal layer primarily from horizontal surfaces selective to the constituent material of the substrate 40.

Figure 17:
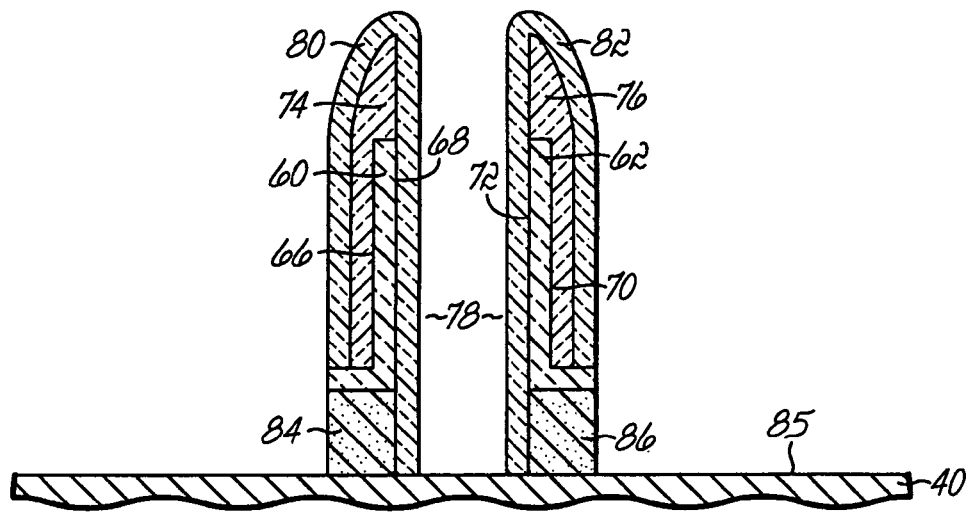

With reference to FIG. 17 in which like reference numerals refer to like features in FIG. 16 and at a subsequent fabrication stage, any remnants of layer 64 remaining after the fabrication stage of FIG. 15 are removed from surface 48 by an etching process, such as RIE, that is selective to the material constituting the spacers 74, 76 and the material constituting the spacers 80, 82. The etching process may also etch vertically into the monocrystalline silicon of substrate 40 exposed by the trench 78 between the fins 60, 62. The etching process continues with the removal of the modified surface region 54 of porous silicon to the depth of monocrystalline silicon of substrate 40.

Spacers 80, 82 protect the fins 60, 62, respectively, from the etching process, thus preserving the thickness of the fins 60, 62. Spacer 74 and spacer 80 also mask a residual region 84 of porous silicon beneath fin 60 during the etching process. Spacer 76 and spacer 82 mask a residual region 86 of porous silicon beneath fin 62 during the etching process. The regions 84, 86 define self-aligned pedestals that elevate the fins 60, 62, respectively, above the plane defined by a surface 85 formerly at the interface between the monocrystalline silicon of substrate 40 and the modified surface region 54 and exposed after the modified surface region 54 is removed.

Figure 18:
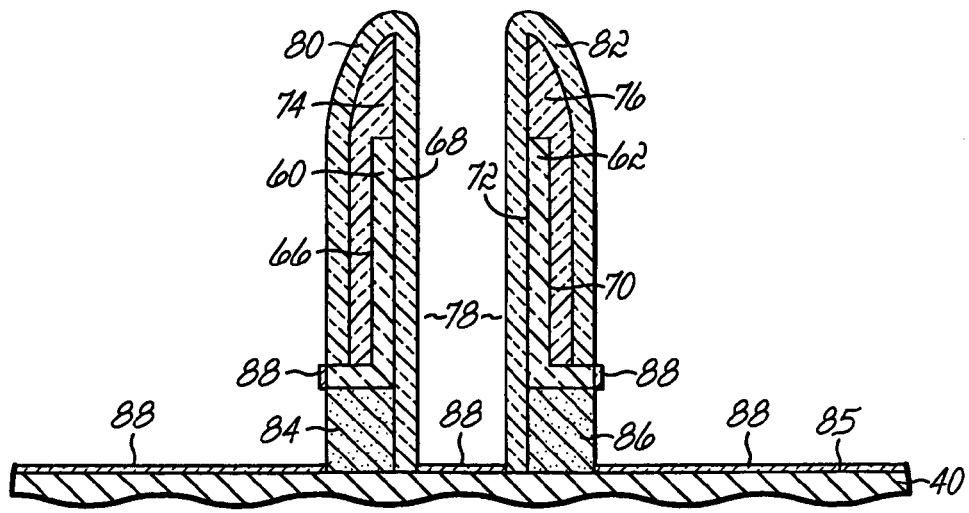

With reference to FIG. 18 in which like reference numerals refer to like features in FIG. 17 and at a subsequent fabrication stage, the regions 84, 86 of porous silicon are converted to oxide (e.g., silicon dioxide) by a thermal oxidation process. The insulating material in region 84 electrically isolates fin 60 from the substrate 40 and has a sidewall or perimeter aligned substantially vertically with the fin 60. Similarly, the insulating material in region 86 electrically isolates fin 62 from the substrate 40 and has a sidewall or perimeter aligned substantially vertically with fin 62.

The thermal oxidation process converting regions 84, 86 to oxide may be performed in a dry or wet oxidizing ambient atmosphere and at a temperature ranging from about 750° C. to about 1100° C. The oxidation process may be a high pressure oxidation process characterized by a high oxidation rate at a relatively low process temperature. Because an oxygen-containing species diffuses rapidly through the porous silicon of regions 84, 86, oxidation of regions 84, 86 is relatively rapid relative to the oxidation of substrate 40 and fins 60, 62. Nevertheless, the thermal oxidation process also forms a thin oxide layer 88 on the exposed surface 85 of substrate 40.

Figure 19:
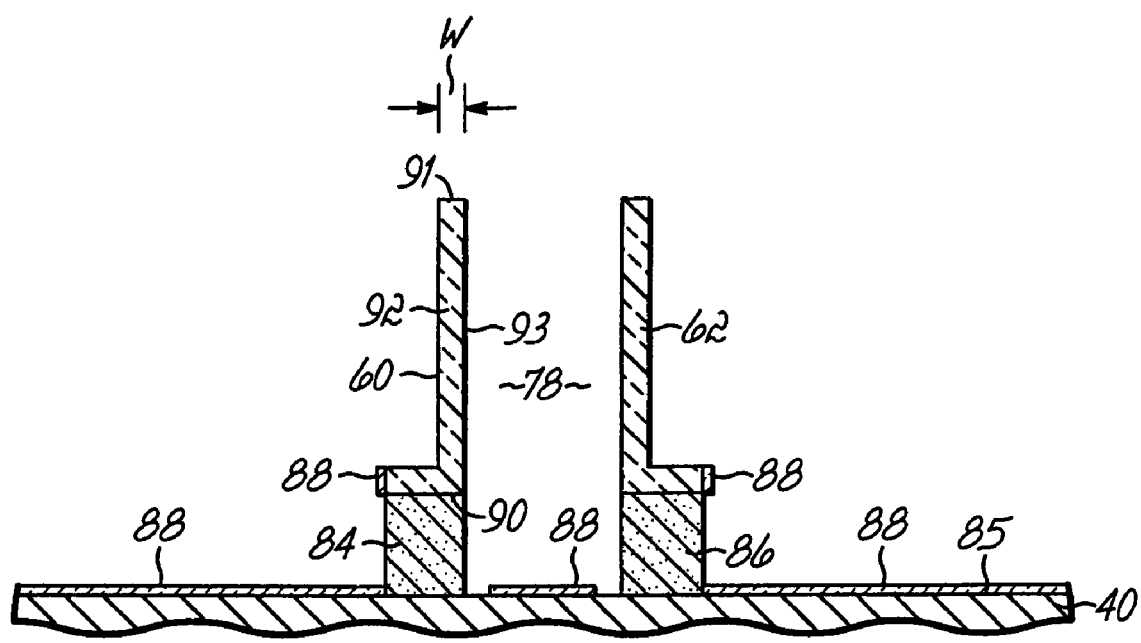

With reference to FIG. 19 in which like reference numerals refer to like features in FIG. 18 and at a subsequent fabrication stage, the spacers 74, 76 and spacers 80, 82 are removed from the fins 60, 62. If spacers 74, 76 and spacers 80, 82 are composed of nitride and regions 84, 86 are oxide, spacers 74, 76 and spacers 80, 82 may be removed by an etching process that removes nitride selective to silicon in the fins 60, 62 and selective to oxide in the regions 84, 86. For example, a wet isotropic etch process using hot acid, such as phosphoric acid, may be employed to remove nitride relative to oxide. If desired, layer 88 may be removed by an anisotropic etching process that removes the constituent oxide of layer 88 selective to the material of the substrate 40 and fins 60, 62 (e.g., silicon).

Fin 60 includes a base 90 that contacts the corresponding region 84, a tip 91 opposite base 90, and sidewalls 92, 93 connecting the base 90 with the tip 91. Fin 60 has a width, W, measured between the sidewalls 92, 93 that may be evaluated at any vertical location between the base 90 and tip 91. The fins 60, 62 extend or project substantially perpendicular to the respective intervening regions 84, 86, which provide electrical isolation with substrate 40. The thickness of epitaxially-grown monocrystalline silicon on the sidewalls 50, 52 of mandrel 44 (FIG. 11) that forms fin 60 is accurately controlled because of the ability to accurately control thickness during deposition e.g., selective epitaxial growth process), as opposed to material removal during a subtractive etching process. Consequently, any variation in the width of fin 60 between the base 90 and tip 91 is significantly less than the width variations that may occur in fins formed by conventional fabrication techniques that utilize subtractive etching to pattern a layer of single crystal silicon. Advantageously, the width of fin 60 is substantially uniform at any vertical location between base 90 and tip 91 so that the sidewalls 92, 93 have a substantially straight vertical profile in a direction perpendicular to the horizontal plane of surface 85 and the upper surface of region 84. The variation in the width is expected to be less than about one (1) percent. Similar considerations apply to fin 62, which is identical or substantially identical to fin 60, and to other fins (not shown) identical or substantially identical to fins 60, 62 distributed across the substrate 40.

The fins 60, 62, which are to be used for subsequent FinFET fabrication, are left free standing as narrow vertical structures of single crystal semiconductor material (e.g., silicon) on a dielectric substrate defined by the oxidized regions 84, 86. The fins 60, 62 may have a width that is less than the minimum lithographic dimension and a relatively high aspect ratio. Subsequent fabrication steps include forming a gate electrode, a gate dielectric, and source/drain regions required for the operation of a FinFET, as described above for FinFET 25 (FIG. 7).

References herein to terms such as "vertical", "horizontal", etc. are made by way of example, and not by way of limitation, to establish a frame of reference. The term "horizontal" as used herein is defined as a plane parallel to the conventional plane or surface of SOI wafer 10 or substrate 40, regardless of the actual spatial orientation of SOI wafer 10 or substrate 40. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structures herein have been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative examples shown and described. Accordingly, departures may be made from such details without departing from the spirit or scope of applicants' general inventive concept.

What is claimed is:

1. A method of fabricating a semiconductor structure on a substrate, the method comprising:

forming a mandrel composed of a crystalline material and having a sidewall oriented substantially perpendicular to the substrate;

forming a body of monocrystalline silicon on the sidewall of the mandrel using the crystalline material of the mandrel to establish epitaxial growth of the monocrystalline silicon of the body; and removing the mandrel after the body is formed.

2. The method of claim 1 wherein the crystalline material of the mandrel is composed of porous silicon, and further comprising:

sealing pores in the porous silicon intersecting the sidewall of the mandrel before forming the body.

3. The method of claim 1 wherein the substrate comprises monocrystalline silicon, and forming the mandrel further comprises:

patterning the monocrystalline silicon of the substrate to define the mandrel; and converting the mandrel from monocrystalline silicon to porous silicon.

4. The method of claim 3 wherein the mandrel has a surface covered by a cap after patterning, and further comprising:

protecting the surface of the mandrel contacted by the cap against formation of an extraneous layer of monocrystalline silicon when the body is formed; and covering a sidewall of the body with a spacer.

5. The method of claim 4 wherein removing the mandrel further comprises:

removing the cap to expose the surface of the mandrel; and directing an etchant to the exposed surface of the mandrel to remove the mandrel while protecting the sidewall of the body with the spacer.

6. The method of claim 5 further comprising:

removing the spacer to expose the sidewall of the body.

7. The method of claim 3 further comprising:

converting a surface layer of the substrate adjacent to the body from monocrystalline silicon to porous silicon when the mandrel is converted to porous silicon.

8. The method of claim 7 further comprising:

protecting a sidewall of the body with a spacer that masks a portion of the surface layer underlying the body;

removing unmasked portions of the surface layer of porous silicon;

oxidizing the masked portion of the surface layer to define a dielectric region separating the body from the substrate; and removing the spacer to expose the sidewall of the body.

9. The method of claim 1 wherein the mandrel has a surface covered by a cap before the body is formed, and forming the body further comprises:

protecting the surface of the mandrel contacted by the cap against formation of an extraneous layer of the monocrystalline silicon.

10. The method of claim 9 wherein removing the mandrel further comprises:

removing the cap to expose the surface of the mandrel after the body is formed; and directing an etchant to the exposed surface of the mandrel to remove the mandrel selective to the body.

11. The method of claim 1 wherein the substrate comprises a buried insulator layer of a semiconductor-on-insulator wafer having a semiconductor-on-insulator layer of monocrystalline silicon on the buried insulator layer, and forming the mandrel further comprises:

converting the monocrystalline silicon of the semiconductor-on-insulator layer to porous silicon; and patterning the porous silicon of the converted semiconductor-on-insulator layer to define the mandrel.

12. The method of claim 11 wherein the mandrel has a surface covered by a cap before the body is formed, and forming the body further comprises:

protecting the surface of the mandrel contacted by the cap against formation of an extraneous layer of monocrystalline silicon when the body is formed.

13. The method of claim 12 wherein removing the mandrel further comprises:

removing the cap to expose the surface of the mandrel after the body is formed; and directing an etchant to the exposed surface of the mandrel to remove the mandrel selective to the body.

14. The method of claim 1 wherein forming the body further comprises:

masklessly growing an epitaxial layer of the monocrystalline silicon to form the body on the sidewall of the mandrel.

15. The method of claim 1 further comprising:

fabricating a fin body of a fin-type field effect transistor using the body of monocrystalline silicon.

* * * * *

UNITED STATES PATENT AND TRADEMARK OFFICE
CERTIFICATE OF CORRECTION

PATENT NO. : 7,638,381 B2  Page 1 of 1
APPLICATION NO. : 11/246830
DATED : December 29, 2009
INVENTOR(S) : Cheng et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 408 days.

Signed and Sealed this

Ninth Day of November, 2010

David J. Kappos
*Director of the United States Patent and Trademark Office*